(12) United States Patent
Hwang et al.

(10) Patent No.: US 12,016,128 B2
(45) Date of Patent: Jun. 18, 2024

(54) CIRCUIT BOARD AND METHOD OF MANUFACTURING THE SAME

(71) Applicant: LG INNOTEK CO., LTD., Seoul (KR)

(72) Inventors: Min Young Hwang, Seoul (KR); Byeong Kyun Choi, Seoul (KR); Jin Seok Lee, Seoul (KR); Moo Seong Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 10 days.

(21) Appl. No.: 17/462,157

(22) Filed: Aug. 31, 2021

(65) Prior Publication Data
US 2022/0071016 A1 Mar. 3, 2022

(30) Foreign Application Priority Data

Sep. 3, 2020 (KR) .................. 10-2020-0112485
Sep. 7, 2020 (KR) .................. 10-2020-0113658

(51) Int. Cl.
*H05K 3/10* (2006.01)
*H05K 1/09* (2006.01)

(52) U.S. Cl.
CPC ............. *H05K 3/10* (2013.01); *H05K 1/09* (2013.01); *H05K 2201/0355* (2013.01); *H05K 2201/0358* (2013.01); *H05K 2201/0959* (2013.01); *H05K 2203/0723* (2013.01)

(58) Field of Classification Search
CPC .... H05K 3/10; H05K 1/09; H05K 2201/0355; H05K 2201/0358; H05K 2201/0959; H05K 2203/0723
USPC ......................................... 361/748
See application file for complete search history.

(56) References Cited

U.S. PATENT DOCUMENTS 10,952,329 B2 3/2021 Han et al.
2020/0335277 A1* 10/2020 Kodama ............... H01F 27/288

FOREIGN PATENT DOCUMENTS

| KR | 10-2014-0132229 | 11/2014 |
| KR | 10-2016-0133164 | 11/2016 |
| KR | 10-2017-0048754 | 5/2017 |
| KR | 10-2021-0091499 | 7/2021 |

OTHER PUBLICATIONS

English Translation of Im et al. (Korean Patent Publication No. 10-2021-0091499), Jul. 22, 2021 (Year: 2021).*

* cited by examiner

*Primary Examiner* — Tremesha S Willis
(74) *Attorney, Agent, or Firm* — KED & Associates LLP

(57) ABSTRACT

A circuit board according to an embodiment includes an insulating layer; and a circuit pattern disposed on the insulating layer, wherein the circuit pattern includes a copper foil layer disposed on the insulating layer, a first plating layer disposed on the copper foil layer, and a second plating layer disposed on the first plating layer, and wherein the copper foil layer has a thickness in a range of 2 μm to 5 μm.

16 Claims, 8 Drawing Sheets

CIRCUIT BOARD AND METHOD OF MANUFACTURING THE SAME

CROSS-REFERENCE TO RELATED APPLICATIONS

The present application claims priority under 35 U.S.C. 119 and 35 U.S.C. 365 to Korean Patent Application Nos. 10-2020-0112485 (filed on Sep. 3, 2020) and 10-2020-0113658 (filed on Sep. 7, 2020), which is hereby incorporated by reference in its entirety.

BACKGROUND

A printed circuit board (PCB) is formed by printing a circuit line pattern with a conductive material such as copper on an insulating substrate, and refers to a board immediately before mounting an electronic component. That is, in order to densely mount many types of electronic devices on a flat plate, it means a circuit board on which a mounting position of each part is determined and a circuit pattern connecting the parts is printed on the flat plate surface and fixed.

The components mounted on the circuit board may transmit a signal generated from the component by a circuit pattern connected to each component.

On the other hand, along with the recent high-functioning of portable electronic devices, etc., in order to perform high-speed processing of a large amount of information, high-frequency signals are being increased, and circuit patterns of circuit boards suitable for high-frequency applications are required.

At this time, the circuit pattern of the circuit board should minimize the transmission loss of the signal, so that the signal transmission is possible without degrading the quality of the high-frequency signal.

An insulating layer of the circuit board for high frequency applications may have isotropy of electrical properties for ease of circuit pattern design and process, low reactivity with metal wiring materials, low ionic conductivity and sufficient mechanical strength to withstand processes such as chemical mechanical polishing (CMP), low moisture absorption which can prevent delamination or increase in permittivity, heat resistance to withstand the processing temperature, and a low coefficient of thermal expansion to eliminate cracking due to temperature change.

In addition, the insulating layer of the circuit board for high-frequency applications must satisfy various conditions such as adhesive strength that can minimize various stresses and peeling occurring at the interface with the metal thin film layer, crack resistance, low stress and low high-temperature gas generation. Accordingly, the insulating layer may be implemented with a resin coated copper (RCC).

However, the resin coated copper (RCC) is reducing the content of the filler to implement a low dielectric constant. In addition, as the content of the filler decreases, it is difficult to implement a normal via hole shape. For example, when a via hole is formed in a low-dielectric-constant RCC through a laser drilling method, there is a limitation in forming a via hole having a target microscopic size (eg, 50 μm or less).

Accordingly, there is a need for a new RCC capable of forming a fine circuit pattern and fine via hole for circuit integration, and a circuit board including the same.

SUMMARY

In the embodiment, it is possible to provide a new RCC capable of forming fine circuit patterns and fine via holes, and a circuit board including the same.

In addition, the embodiment provides a circuit board having a new structure and a method of manufacturing the same.

In addition, in the embodiment, a circuit board capable of improving bonding strength with a plating layer by implementing a surface roughness of a certain level or more on an inner wall of a via hole formed in an insulating layer, and a method for manufacturing the same.

The technical problems to be achieved in the proposed embodiment are not limited to the technical problems mentioned above, and other technical problems not mentioned may be clearly understood by those of ordinary skill in the art to which the proposed embodiment belongs from the following description.

A circuit board according to an embodiment includes an insulating layer; and a circuit pattern disposed on the insulating layer, wherein the circuit pattern includes a copper foil layer disposed on the insulating layer, a first plating layer disposed on the copper foil layer, and a second plating layer disposed on the first plating layer, and wherein the copper foil layer has a thickness in a range of 2 μm to 5 μm.

In addition, the insulating layer and the copper foil layer is a Resin Coated Copper (RCC).

In addition, the copper foil layer has a 10-point average roughness (Rz) in a range of 1.5 μm to 3.0 μm.

In addition, the first plating layer has a thickness in a range of 1 μm to 2.5 μm.

In addition, the second plating layer has a thickness in a range of 10 μm to 25 μm.

In addition, the circuit board includes a via disposed in a via hole passing through the insulating layer.

The via hole includes at least one recess.

In addition, a depth of the recess has a range of 0.5 μm to 1.0 μm.

In addition, the insulating layer includes a resin and a filler in the resin, and the recess has a width corresponding to the filler.

In addition, a diameter of the filler has a range of 0.5 μm to 1.0 μm.

In addition, an area of the recess is 3% to 10% of a total area of an inner wall of the via hole.

In addition, the inner wall of the via hole has a surface roughness (Ra) in a range of 0.5 μm to 1.0 μm, the via has a surface roughness corresponding to the inner wall of the via hole.

The inner wall of the via hole includes a first portion corresponding to the resin and a second portion corresponding to the filler, and the via contacts the first portion and the second portion, respectively.

In addition, the first portion and the second portion have a surface roughness (Ra) in a range of 0.5 μm to 1.0 μm.

The via includes a first via layer corresponding to the first plating layer and a second via layer corresponding to the second plating layer.

On the other hand, the method of manufacturing a circuit board according to an embodiment includes: preparing a resin coated copper (RCC) including an insulating layer that is a composite of a resin and a filler, and a copper foil layer disposed on the insulating layer; forming a via hole passing through the insulating layer; removing a filler exposed through an inner wall of the via hole; forming a first plating layer on an inner wall of the via hole from which the filler is removed, and forming a second plating layer filling the via hole on the first plating layer, wherein a recess corresponding to the removed filler is formed on the inner wall of the via hole, and wherein the recess has a depth in a range of 0.5 μm to 1.0 μm.

In addition, the filler has a diameter in a range of 0.5 μm to 1.0 μm.

In addition, an area of the recess is 3% to 10% of a total area of an inner wall of the via hole.

On the other hand, the method of manufacturing a circuit board according to an embodiment includes: preparing a resin coated copper (RCC) including an insulating layer which is a composite of a resin and a filler, and a copper foil layer disposed on the insulating layer; forming a via hole passing through the insulating layer; surface-treating the resin and filler exposed through the inner wall of the via hole by using plasma, wherein the inner wall of the via hole has a surface roughness (Ra) in a range of 0.5 μm to 1.0 μm by the surface treatment; forming a first plating layer on an inner wall of the surface-treated via hole, and forming a second plating layer filling the via hole on the first plating layer.

In addition, the inner wall of the surface-treated via hole includes a first portion corresponding to a resin exposed through the via hole, and a second portion corresponding to a filler exposed through the via hole, wherein the first portion and the second portion have a surface roughness (Ra) in a range of 0.5 μm to 1.0 μm.

According to an embodiment, a resin coated copper (RCC) includes an insulating layer and a copper foil layer. The copper foil layer has a thickness of 2 μm or more. Preferably, the copper foil layer may have a thickness of 2 μm to 5 μm. Accordingly, in the embodiment, the via hole may be formed in the RCC with a size corresponding to the target size, thereby improving product reliability.

In an embodiment, a circuit pattern including the copper foil layer can be miniaturized by controlling the 10-point average roughness (Rz) of the copper foil layer, and signal transmission loss thereof can be minimized.

In the embodiment, the inner wall of the via hole of the insulating layer is surface-treated so that the surface roughness (Ra) of the inner wall of the via hole is in a range of 0.5 μm to 1.0 μm. In the embodiment, a peel strength between the via and the insulating layer formed in the via hole may be improved, and thus product reliability may be improved.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

Before the description of an embodiment of a present application, a resin coated copper of a comparative example will be described.

Figure 1:
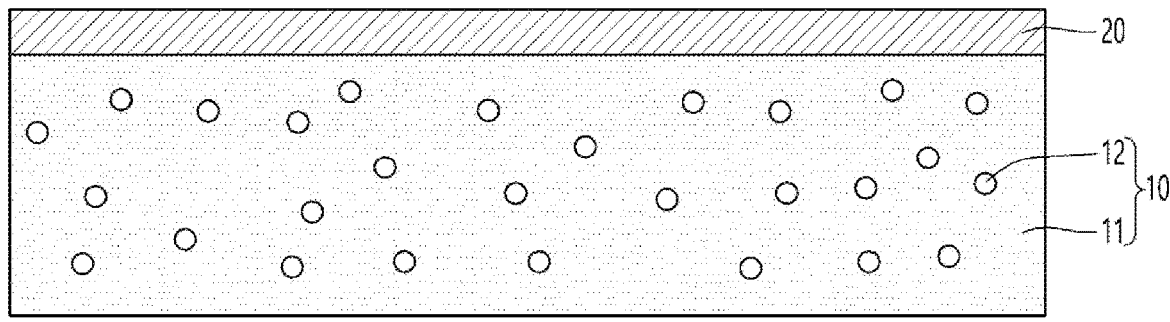
FIG. 1 is a view showing a resin coated copper of a comparative example.
Figure 2:
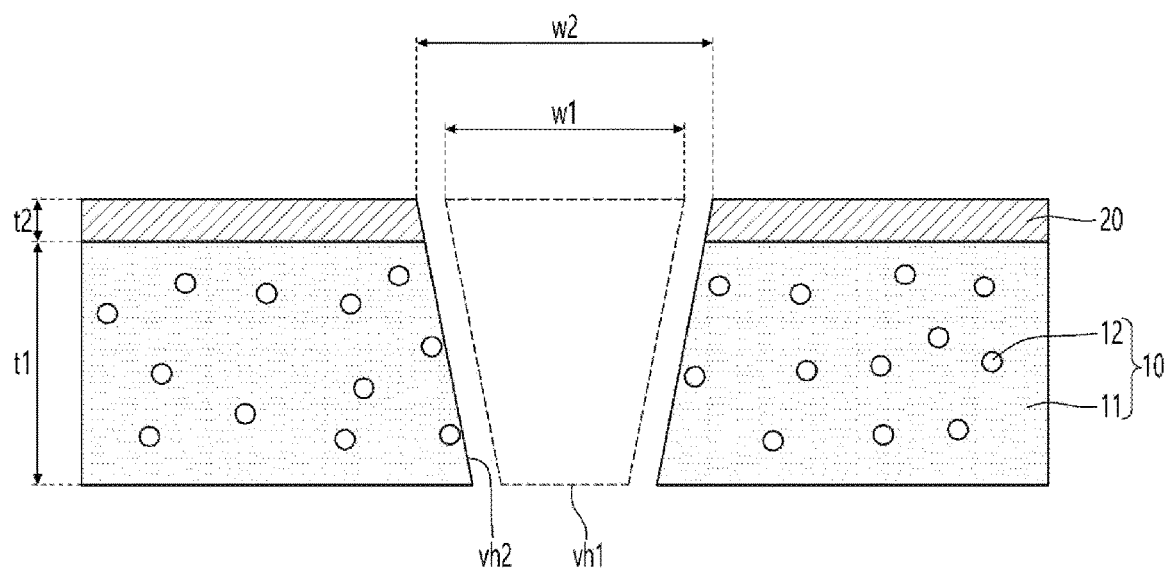
FIG. 2 is a view showing a via hole formed in the resin coated copper of FIG. 1.

FIG. 1 is a view showing a resin coated copper of a comparative example, and FIG. 2 is a view showing a via hole formed in the resin coated copper of FIG. 1.

Referring to FIGS. 1 and 2, the resin coated copper (RCC) of the comparative example includes an insulating layer 10 and a copper foil layer 20. The insulating layer 10 includes a resin 11 and a filler 12 dispersed in the resin 11. That is, the insulating layer 10 is a composite of the resin 11 and the filler 12 dispersed in the resin 11. The insulating layer 10 has a low dielectric constant.

The copper foil layer 20 is disposed on one side or both sides of the insulating layer 10. The copper foil layer 20 is disposed on one or both surfaces of the insulating layer 10 to have a predetermined thickness.

A thickness t1 of the insulating layer 10 has a range of 20 μm and 25 μm. In addition, a thickness t2 of the copper foil layer 20 is about 1.0 µm. For example, the thickness t2 of the copper foil layer 20 is 1.5 µm or less.

However, when a circuit board is manufactured using the resin coated copper (RCC) including such the insulating layer 10 and the copper foil layer 20, there is a problem in that the size of the via hole cannot be formed to a desired size.

Specifically, in order to have the dielectric constant of the insulating layer 10 below a certain level, a content of the filler 12 is reduced while glass fibers are not included therein, and thus the rigidity is reduced.

At this time, the copper foil layer 20 is disposed on at least one surface of the insulating layer 10, thereby giving the insulating layer 10 a certain level of rigidity or more. However, the thickness t2 of the copper foil layer 20 is 1.5 µm or less, and accordingly, sufficient rigidity is not provided to the insulating layer 10.

Thereby, there is a problem in that the via hole of the desired target size cannot be formed in the resin coated copper (RCC). In particular, when a small size via hole is to be formed in the resin coated copper (RCC), a via hole having a size larger than a target size is formed in the resin coated copper (RCC). This is because, as the rigidity of the resin coated copper (RCC) is weak, a large process deviation occurs during the laser process for forming the via hole.

For example, in the comparative example, in the case of forming a via hole vh1 having a first width w1 based on an upper width of the via hole, a via hole vh2 having a second width w2 greater than the first width w1 is formed in the resin coated copper (RCC). Accordingly, the resin coated copper (RCC) of the comparative example has a limitation in forming a via hole of a fine size, and thus it is difficult to cope with a fine pitch, and it is difficult to apply it to an integrated circuit board.

Hereinafter, it will be described with respect to the resin coated copper (RCC) and the circuit board according to the embodiment for solving the problems of the resin coated copper (RCC) of the comparative example as described above.

Figure 3:
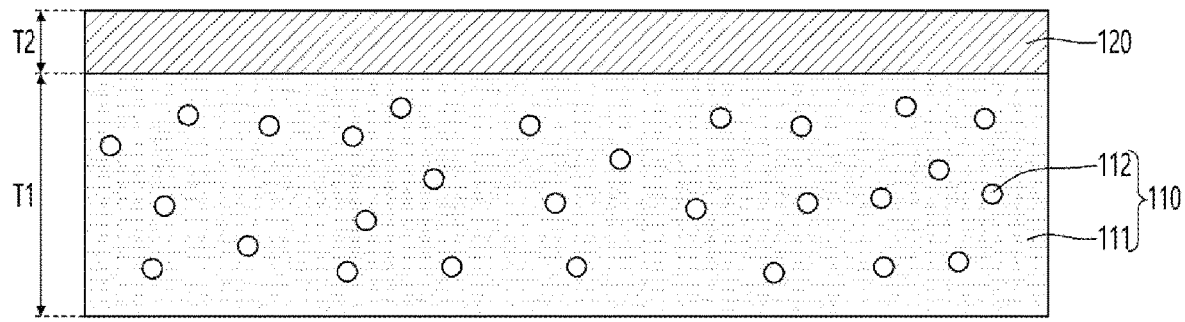
FIG. 3 is a view showing a resin coated copper of an embodiment.
Figure 4:
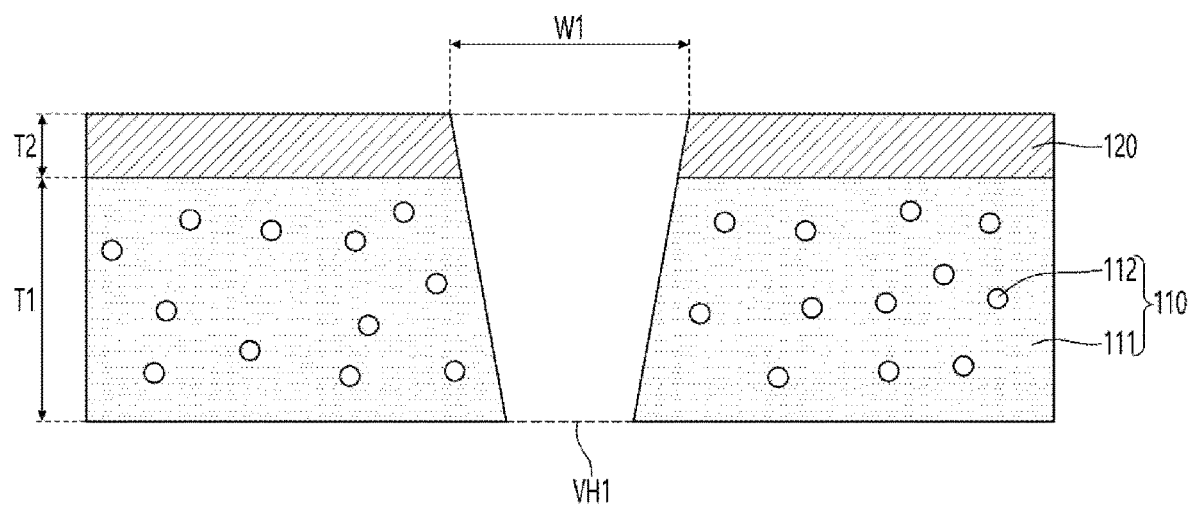
FIG. 4 is a view showing a via hole formed in the resin coated copper of FIG. 3.
Figure 5:
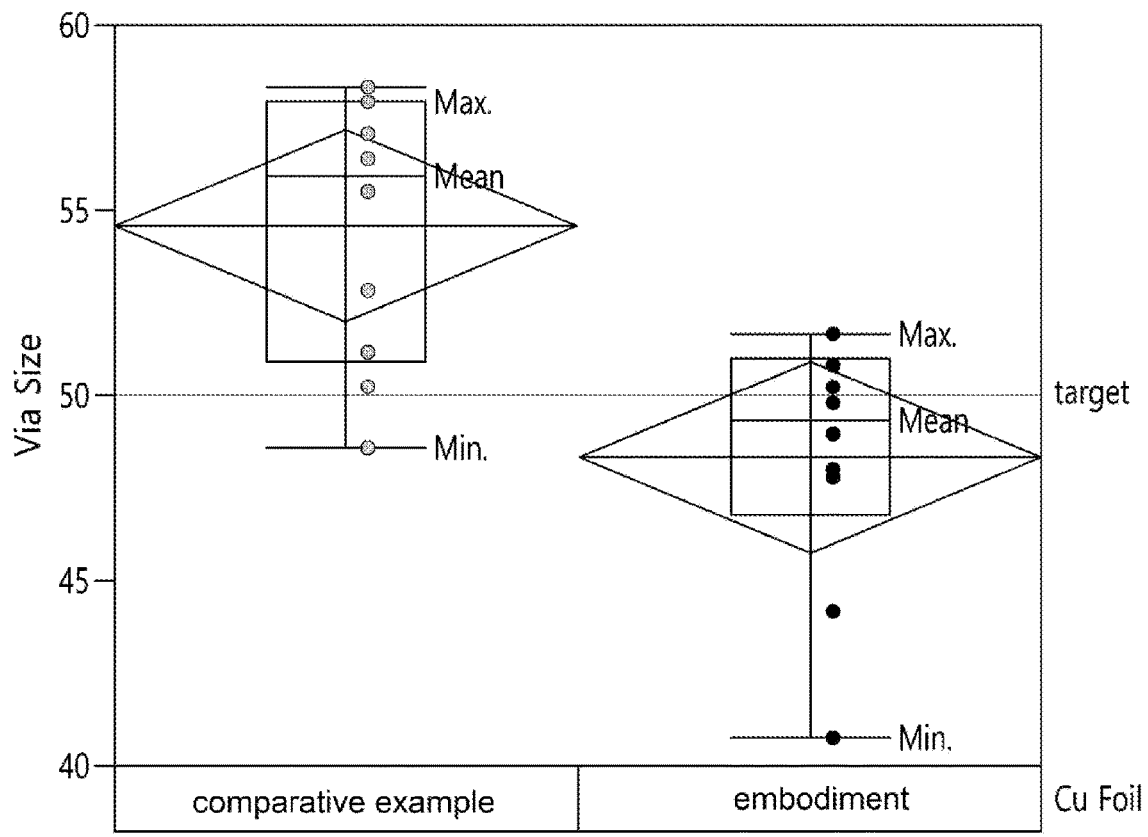
FIG. 5 is a view showing a difference between a target size and an actual via hole size in the comparative example and the embodiment.

FIG. 3 is a view showing a resin coated copper of an embodiment, FIG. 4 is a view showing a via hole formed in the resin coated copper of FIG. 3, and FIG. 5 is a view showing a difference between a target size and an actual via hole size in the comparative example and the embodiment.

Referring to FIGS. 3 to 5, a resin coated copper (RCC) comprises an insulating layer 110 including a resin 111 and a filler 112 dispersedly disposed in the resin 111, and a copper foil layer 120 disposed on the insulating layer 110.

The insulating layer 110 may have a low dielectric constant. For example, the insulating layer 110 may have a dielectric constant of 2.8 Dk or less. For example, the insulating layer 110 may have a dielectric constant of 2.5 Dk or less.

To this end, the resin 111 of the insulating layer 110 may be used in a modified epoxy or maleimide series. Accordingly, the dielectric constant of the resin 111 constituting the insulating layer 110 can be lowered.

The dielectric constant of the insulating layer 110 is determined by a combination of the dielectric constants of the resin 111 and the filler 112 disposed in the resin 111.

That is, the resin 111 in the embodiment may include a modified epoxy or maleimide series having 2.3 Dk to 2.5 Dk.

In addition, the filler 112 includes a ceramic material of any one of $SiO_2$, $ZrO_3$, $HfO_2$, and $TiO_2$, and may have a dielectric constant in the range of 3.7 to 4.2 Dk.

In this case, the dielectric constant of the insulating layer 110 may be controlled by the dielectric constant of the resin 111, the dielectric constant of the filler 112, and a content of the filler 112 in the insulating layer 110. However, it is difficult to control the dielectric constant of the insulating layer 110 to the level of 2.5 Dk only by controlling it.

Accordingly, the filler 112 in the embodiment may be a porous filler or a hollow filler. The porous filler has a structure in which a non-penetrating groove is formed on a surface of the filler 112. In addition, the hollow filler has a structure in which a through-hole is formed on the surface of the filler 112.

In addition, the filler 112 may have a range between 10 vol. % and 40 vol. % within a total volume of the insulating layer 110. Correspondingly, the resin 111 has 60 vol. % to 90 vol. % in the insulating layer 110.

In addition, in the total volume of the filler 112, the porosity, which is a ratio of the volume of pores such as holes or grooves formed in the filler, may be 20% to 35%. When the porosity of the filler 112 is less than 20%, it is difficult to adjust the dielectric constant of the insulating layer 110 to 2.5 Dk or less. In addition, when the porosity of the filler 112 is greater than 35%, the rigidity of the filler 112 is weakened, and cracks may occur in various environments.

On the other hand, the copper foil layer 120 of the embodiment is disposed on the insulating layer (110). For example, the copper foil layer 120 of the embodiment may be disposed on any one of the upper and lower surfaces of the insulating layer 110. For example, the copper foil layer 120 of the embodiment may be disposed on both the upper surface and the lower surface of the insulating layer 110.

The copper foil layer 120 may be disposed on the insulating layer 110 to have a predetermined thickness T2.

For example, a thickness T1 of the insulating layer 110 may be 10 µm to 15 µm.

In addition, the thickness (T2) of the copper foil layer 120 may have a range of 2 µm to 5 µm. At this time, when the thickness T2 of the copper foil layer 120 is less than 2 µm, the rigidity of the resin coated copper (RCC) may be weakened. In addition, as the rigidity is weakened, it may be difficult to accurately form a size of a via hole formed in the resin coated copper (RCC) to a desired size. In addition, when the thickness T2 of the copper foil layer 120 exceeds 5 µm, the thickness of the wiring (or circuit pattern) including the copper foil layer 120 may increase. Also, as the thickness of the wiring (or circuit pattern) increases, a thickness of the circuit board may increase. In addition, when the thickness T2 of the copper foil layer 120 exceeds 5 µm, there may be difficulties in the process of forming a via hole passing through the copper foil layer 120.

On the other hand, as the thickness of the copper foil layer 120 increases, it may be difficult to refine the wiring (or circuit pattern) formed by etching the copper foil layer 120. For example, as the thickness of the copper foil layer 120 increases, the minimum line width of a circuit pattern that can be formed also increases, and accordingly, it may be difficult to refine the wiring.

Therefore, in the embodiment, the copper foil layer 120 may have a 10-point average roughness (Rz) in a certain range. In other words, when the copper foil layer 120 has a 10-point average roughness (Rz) lower than a predetermined range, the bonding strength with a dry film may be reduced, and accordingly, it may be more difficult to refine the wiring. In addition, when the copper foil layer 120 has a 10-point average roughness higher than a predetermined range, the thickness of the copper foil layer 120 may be increased correspondingly. In addition, when the copper foil layer 120 has a 10-point average roughness higher than a predetermined range, a signal transmission loss may increase due to a skin effect due to an increase in the surface roughness of the wiring.

Accordingly, in the embodiment, the 10-point average roughness (Rz) of the copper foil layer 120 may be 1.5 μm to 3.0 μm. Accordingly, in the embodiment, it is possible to refine the wiring (or circuit pattern) including the copper foil layer 120 by controlling the 10-point average roughness Rz of the copper foil layer 120. And, thereby, it is possible to minimize signal transmission loss.

In addition, the copper foil layer 120 may have the 10-point average roughness (Rz) of both the upper surface and the lower surface in the range of 1.5 μm to 3.0 μm.

Accordingly, a surface of the insulating layer 110 in contact with the copper foil layer 120 may correspond to a 10-point average roughness Rz of the copper foil layer 120. For example, a 10-point average roughness Rz of an upper surface of the insulating layer 110 may have a range of 1.5 μm to 3.0 μm corresponding to the 10-point average roughness Rz of the copper foil layer 120.

Meanwhile, referring to FIGS. 4 and 5, a size of the via hole in the embodiment may correspond to a target size by controlling of the thickness T2 and 10-point average roughness Rz of the copper foil layer 120.

For example, in the case of forming a via hole having a target size of the first width W1, in the embodiment, the copper foil layer 120 has a thickness T2 of 2 μm to 5 μm, and a 10-point average roughness Rz in the range of 1.5 μm to 3.0 μm, so that a size of the via hole VH1 may have a target size.

That is, as in FIG. 5, the copper foil layer of the resin coated copper (RCC) in the comparative example (prior art) has a thickness of 1.5 μm or less and a 10-point average roughness (Rz) of 1.3 μm or less. Accordingly, in the comparative example, when a via hole having a target size of 50 μm is to be formed, an actual size of the via hole is from the minimum (Min) 49 μm to the maximum (Max) 58 μm, and the average size (Mean) had a size of 56.5 μm. Accordingly, there is a problem in that it is difficult to form a via hole having an actual size corresponding to the target size with the resin coated copper (RCC) in the comparative example. In particular, in the comparative example, it is difficult to substantially form a via hole of 50 μm or less, and accordingly, it is difficult to cope with a fine pitch.

On the other hand, in the resin coated copper (RCC) of the embodiment, the copper foil layer 120 has a thickness of 2.0 μm or more, and a 10-point average roughness (Rz) of 1.5 μm or more. Accordingly, in the embodiment, when a via hole having a target size of 50 μm is to be formed, the actual size of the via hole is from a minimum (Min) 41 μm to a maximum (Max) about 52 μm, and an average size (Mean) had a size of 49 μm. That is, when the via hole is formed using the resin coted copper (RCC) of the embodiment, it can be confirmed that the deviation in the size of the via hole is clearly reduced compared to the comparative example, and thus it can be confirmed that there is an advantageous effect in response to the fine pitch.

Figure 6:
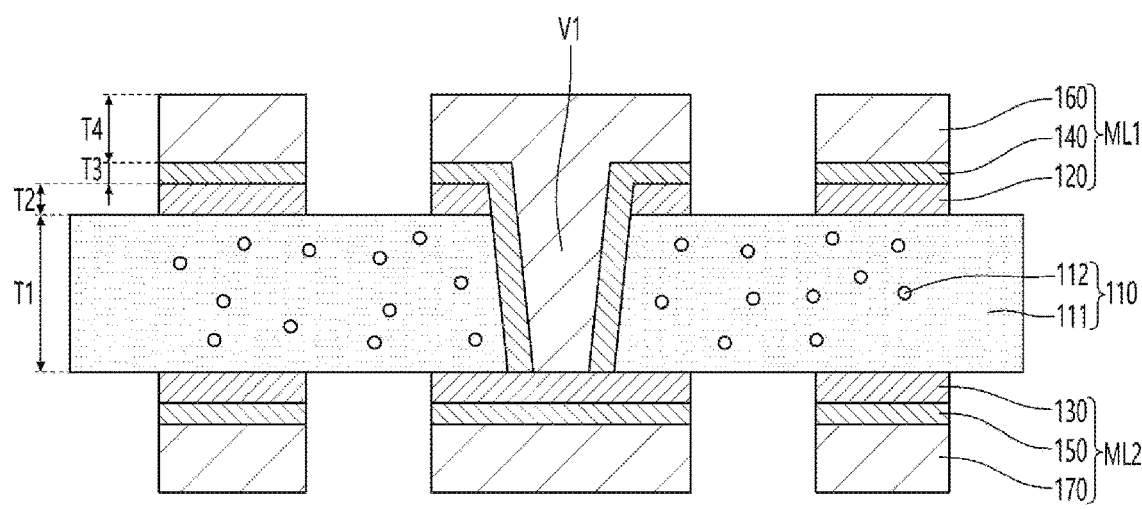
FIG. 6 is a view showing a circuit board manufactured using the resin coated copper of FIG. 3.

FIG. 6 is a view showing a circuit board manufactured using the resin coated copper of FIG. 3.

Referring to FIG. 6, the circuit board may include an insulating layer 110, circuit patterns ML1 and ML2 formed on at least one surface of the insulating layer 110, and a via V1 passing through the insulating layer 110.

Here, a portion of the insulating layer 110 and the circuit patterns ML1 and ML2 among an entire layer structure of the circuit board is the resin coated copper (RCC) of FIG. 3.

Specifically, the circuit board in the embodiment includes an insulating layer 110, a first circuit pattern ML1 disposed on a first surface of the insulating layer 110, a second circuit pattern ML2 disposed on a second surface of the insulating layer 110, and a via V1 passing through the insulating layer 110 and connecting the first circuit pattern ML1 and the second circuit pattern ML2.

In this case, the first circuit pattern ML1 includes a first copper foil layer 120, a first chemical copper plating layer 140, and a first electrolytic plating layer 160. The first chemical copper plating layer 140 may be referred to as a first plating layer, and the first electrolytic plating layer 160 may be referred to as a second plating layer.

In addition, the second circuit pattern ML2 includes a second copper foil layer 130, a second chemical copper plating layer 150, and a second electrolytic plating layer 170. The second chemical copper plating layer 150 may be referred to as a first plating layer, and the second electrolytic plating layer 170 may be referred to as a second plating layer.

At this time, although it is illustrated that the circuit pattern is disposed on the first and second surfaces of the insulating layer 110 in the drawing, respectively, the present invention is not limited thereto. For example, the circuit pattern may be disposed on only one of the first and second surfaces of the insulating layer 110.

In addition, although it has been described that the circuit board has a single-layer structure based on a number of insulating layers in the drawings, the present invention is not limited thereto. For example, the circuit board may have a structure of two or more layers based on the number of the insulating layer.

Hereinafter, the circuit board will be described as having a one-layer structure based on the number of insulating layers, and circuit patterns formed on both sides of the insulating layer 110.

In the circuit board, the insulating layer 110, the first copper foil layer 120, and the second copper foil layer 130 may be the resin coated copper (RCC) of the embodiment described with reference to FIG. 3.

That is, in the circuit board according to the embodiment, the first circuit pattern ML1 and the second circuit pattern ML2 may be formed through a Modified Semi Additive Process (MSAP) method. Accordingly, each of the first circuit pattern ML1 and the second circuit pattern ML2 of the circuit board includes a plurality of layers, and one of the plurality of layers may be a copper foil layer of the resin coated copper (RCC).

Accordingly, the insulating layer 110 may be a composite of the resin 111 and the filler 112.

In addition, the insulating layer 110 may have a 10-point average roughness (Rz) of the first surface and the second surface in the range of 1.5 μm to 3.0 μm. In addition, the insulating layer 110 may have a thickness T1 in the range of 10 μm to 15 μm.

A first circuit pattern ML1 and a second circuit pattern ML2 are disposed on the first and second surfaces of the insulating layer 110, respectively.

The first circuit pattern ML1 includes a first copper foil layer 120 disposed on the first surface of the insulating layer 110, a first chemical copper plating layer 140 disposed on the first copper foil layer 120, and a first electrolytic plating layer 160 disposed on the first chemical copper plating layer 140.

The thickness T2 of the first copper foil layer 120 may be in a range of 2 μm to 5 μm. In addition, the first copper foil layer 120 may have a 10-point average roughness Rz in the range of 1.5 μm to 3.0 μm. For example, the first copper foil layer 120 includes a lower surface in contact with the first surface of the insulating layer 110 and an upper surface in contact with the lower surface of the first chemical copper plating layer 140. In addition, the 10-point average roughness Rz of each of the upper and lower surfaces of the first copper foil layer 120 may be in a range of 1.5 μm to 3.0 μm.

The first chemical copper plating layer 140 may be disposed on the first copper foil layer 120.

The first chemical copper plating layer 140 may be a seed layer of the first electrolytic plating layer 160. The first chemical copper plating layer 140 may be formed by a chemical copper plating method. The chemical copper plating method may be processed in the order of a degreasing process, a soft corrosion process, a pre-catalyst treatment process, a catalyst treatment process, an activation process, an electroless plating process, and an antioxidant treatment process.

In addition, the thickness (T3) of the first chemical copper plating layer 140 may vary depending on the plating method. For example, the first chemical copper plating layer 140 may be formed of any one of heavy copper plating of 2.5 μm or more, medium copper plating of 1 μm to 2.5 μm, and light copper plating of 1 μm or less. Preferably, the thickness T3 of the first chemical copper plating layer 140 is medium copper plating, and may satisfy 1 μm to 2.5 μm.

The first electrolytic plating layer 160 is disposed on the first chemical copper plating layer 140. The first electroplating layer 160 may be formed by electroplating the first chemical copper plating layer 140 as a seed layer.

The first electrolytic plating layer 160 may be disposed on the first chemical copper plating layer 140 to have a predetermined thickness. The thickness T3 of the first electroplating layer 160 may be in a range of 10 μm to 25 μm. Preferably, the thickness of the first electroplating layer 160 may be 10 μm±2 μm.

That is, the circuit pattern includes a copper foil layer, a chemical copper plating layer and an electrolytic plating layer. In this case, the thickness of the circuit pattern may be generally 13 μm to 28 μm. At this time, in the embodiment, the thickness of the first copper foil layer 120 was increased compared to the comparative example. Accordingly, the thickness T3 of the first electroplating layer 160 in the embodiment may be reduced compared to the comparative example. In other words, in the embodiment, the thickness of the first electrolytic plating layer 160 may decrease by the increase in the thickness of the first copper foil layer 120.

Preferably, a ratio of the thickness of each of the first copper foil layer 120, the first chemical copper plating layer 140 and the first electrolytic plating layer 160 in the embodiment may be 1:0.5:5.

Meanwhile, a second copper foil layer 130, a second chemical copper plating layer 150, and a second electrolytic plating layer 170 may be disposed on the second surface of the insulating layer 110. In this case, the second copper foil layer 130 is substantially the same as the first copper foil layer 120, and the second chemical copper plating layer 150 is substantially the same as the first chemical copper plating layer 140, and the second electrolytic plating layer 170 is substantially the same as the first electrolytic plating layer 160. Accordingly, detailed descriptions of the second copper foil layer 130, the second chemical copper plating layer 150, and the second electrolytic plating layer 170 will be omitted.

As described above, the thickness of the copper foil layer included in the resin coated copper (RCC) in the embodiment is increased compared to the comparative example, and thus the 10-point average roughness (Rz) of the copper foil layer is increased compared to the comparative example, and thus the size of the via hole may be adjusted to correspond to the target size, and may be able to respond to a fine pitch.

Figure 7:
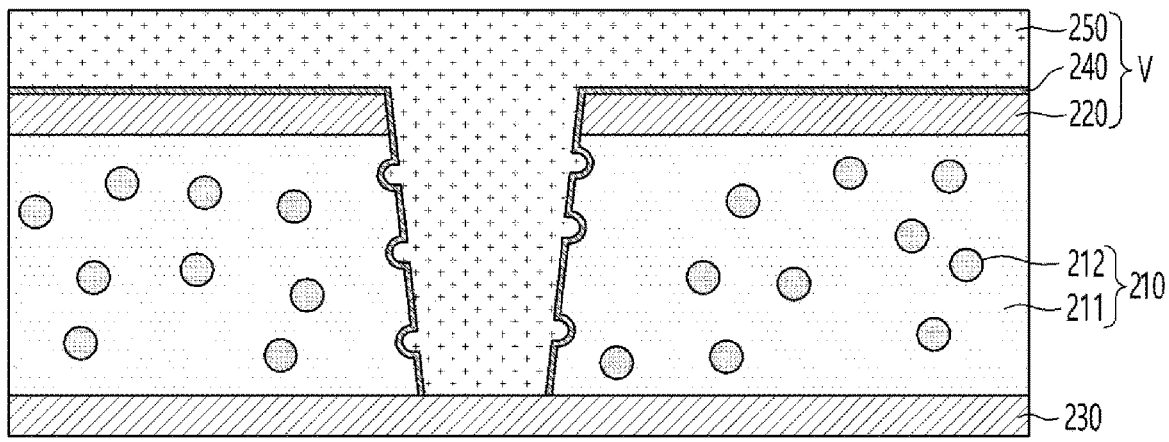
FIG. 7 is a view showing a circuit board according to a second embodiment.

FIG. 7 is a view showing a circuit board according to a second embodiment.

Referring to FIG. 7, the circuit board includes an insulating layer 210, a copper foil layer 220, a first plating layer 240, and a second plating layer 250. In this case, some of the copper foil layer 220, the first plating layer 240, and the second plating layer 250 may constitute a via V filling in the via hole VH formed in the insulating layer 210.

The first plating layer 240 may correspond to the first chemical copper plating layer 140 of FIG. 6, and the second plating layer 250 may correspond to the first electrolytic plating layer 160 of FIG. 6.

Since the basic characteristics of the insulating layer 210, the copper foil layer 220, the first plating layer 240 and the second plating layer 250 have already been described above, a detailed description thereof will be omitted.

Figure 10:
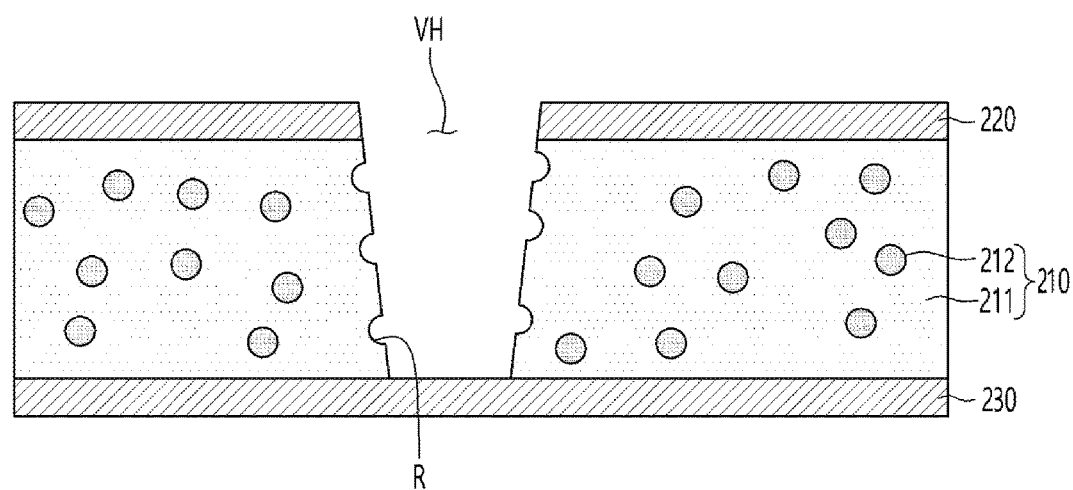

An inner wall of the via hole of the insulating layer 210 may include a recess (R, see FIG. 10). In addition, at least a portion of the first plating layer 240 may be disposed in the recess (R).

Specifically, a via hole (VH) is formed in the insulating layer 210. In this case, the insulating layer 210 includes a resin 211 and a filler 212. Also, in the process of forming the via hole VH, a portion of the filler 212 may be exposed in the via hole VH. When the filler 212 is exposed in the via hole VH, the size of the via hole may be reduced by the exposed filler 212. Also, there may be a problem in signal transmissibility through the via (V). In addition, the insulating layer 210 may have a low surface roughness as it has a low dielectric constant. For example, the insulating layer 210 may have a surface roughness (Ra) in a range of 0.05 μm to 0.11 μm. Accordingly, when the first plating layer 240 is formed on the inner wall of the via hole VH, the peel strength between the first plating layer 240 and the insulating layer 210 may be reduced due to the low surface roughness (Ra) of the insulating layer 210. Accordingly, in the embodiment, in order to solve the above problems, the surface roughness Ra of a certain level or higher is implemented on the inner wall of the via hole VH of the insulating layer 210.

In the second embodiment, the filler 212 exposed through the inner wall of the via hole VH is removed to implement the surface roughness Ra on the inner wall of the via hole VH. Specifically, in the embodiment, after the via hole VH is formed, the filler 212 exposed through the via hole VH is removed. In addition, as the filler 212 is removed, a recess R is formed on the inner wall of the via hole VH corresponding to the position where the filler 212 is exited. In addition, the inner wall of the via hole VH has a surface roughness Ra corresponding to a depth of the recess R. Specifically, the surface roughness Ra of the inner wall of the via hole VH may be referred to as the depth of the recess R. Hereinafter, the surface roughness Ra of the inner wall of the via hole in the first embodiment is the depth of the recess R, and accordingly, it will be described as the depth of the recess R.

At this time, in the embodiment, the depth of the recess (R) formed in the inner wall of the via hole (VH) to have a range of 0.5 μm to 1.0 μm. For example, when the depth of the recess R formed in the inner wall of the via hole VH is less than 0.5 μm, the peel strength between the insulating layer 210 and the first plating layer 240 decreases, accordingly, a reliability problem may occur. Also, when the depth of the recess R of the inner wall of the via hole VH is greater than 1.0 μm, the surface roughness Ra of the first plating layer 240 may increase correspondingly. Also, when the surface roughness Ra of the first plating layer 240 increases, signal transmission loss due to a skin effect may increase. Furthermore, when the depth of the recess R of the inner wall of the via hole VH is greater than 1.0 μm, it means that there are many fillers 212 exposed through the via hole VH. And, this means that the content of the filler 212 in the insulating layer 210 is large. For example, when the surface roughness Ra of the inner wall of the via hole VH is greater than 1.0 μm, it means that the content of the filler 212 included in the insulating layer 210 is high. Accordingly, the insulating layer 210 may not have a low dielectric constant of 2.5 Dk or less. Accordingly, in the embodiment, the depth of the recess R of the inner wall of the via hole VH is in the range of 0.5 μm to 1.0 μm.

Meanwhile, the surface roughness Ra of the inner wall of the via hole VH may be determined by the ratio of the area occupied by the recess R to a total area of the inner wall of the via hole VH. And, in the embodiment, the recess R occupies 3% to 10% of the total area of the inner wall of the via hole VH. That is, when the area occupied by the recess R from the total area of the inner wall of the via hole VH is less than 3%, this indicates that the content of the filler included in the insulating layer 210 is lower than 20%. This means that the insulation layer 210 has a weak rigidity, so it may be difficult to manufacture a normal circuit board. In addition, when the area occupied by the recess R from the total area of the inner wall of the via hole VH is less than 3%, the surface roughness Ra of the inner wall of the via hole VH may be less than 0.5 μm. and thus, reliability problems may occur. In addition, when the area occupied by the recess R in the total area of the inner wall of the via hole VH is greater than 10%, the content of the filler 212 included in the insulating layer 210 may be greater than 80 vol %. Accordingly, the insulating layer 210 may not have a low dielectric constant of 2.5 Dk or less. In addition, when the area occupied by the recess R from the total area of the inner wall of the via hole VH is greater than 10%, the surface roughness Ra of the inner wall of the via hole VH may be greater than 1.0 μm, and thus, a skin effect may occur.

Meanwhile, a plurality of recesses R may be included in the inner wall of the via hole VH. In this case, each of the recesses R may correspond to the shape and diameter of the filler 212. For example, the recess R may have the depth corresponding to a diameter of the filler 212. The filler 212 may have a diameter in the range of 0.5 μm to 1.0 μm. In addition, the depth of the recess R formed in the inner wall of the via hole VH may correspond to the diameter of the filler 212. In addition, when the depth of the recess R is greater than 1.0 μm, the size of the via hole may be excessively expanded in the process of removing the filler exposed through the via hole VH. In addition, reliability problems may occur due to the expansion of the size of the via hole. Accordingly, the filler 212 in the embodiment may have a diameter in the range of 0.5 μm to 1.0 μm, and the recess R may have a depth corresponding to the diameter of the filler 212.

As described above, in the second embodiment, the filler 212 exposed on the inner wall of the via hole VH is removed. Accordingly, in the embodiment, the inner wall of the via hole VH may have a surface roughness Ra corresponding to the depth of the recess R. Accordingly, in the embodiment, the peel strength between the first plating layer 240 and the insulating layer 210 can be improved.

Meanwhile, the second plating layer 250 is disposed on the first plating layer 240. That is, the second plating layer 250 may be disposed using the first plating layer 240 as a seed layer to fill the inside of the via hole VH.

Hereinafter, a method of manufacturing a circuit board according to the second embodiment will be described.

FIGS. 8 to 12 are views showing a method of manufacturing the circuit board according to the second embodiment in the order of the process.

Figure 8:
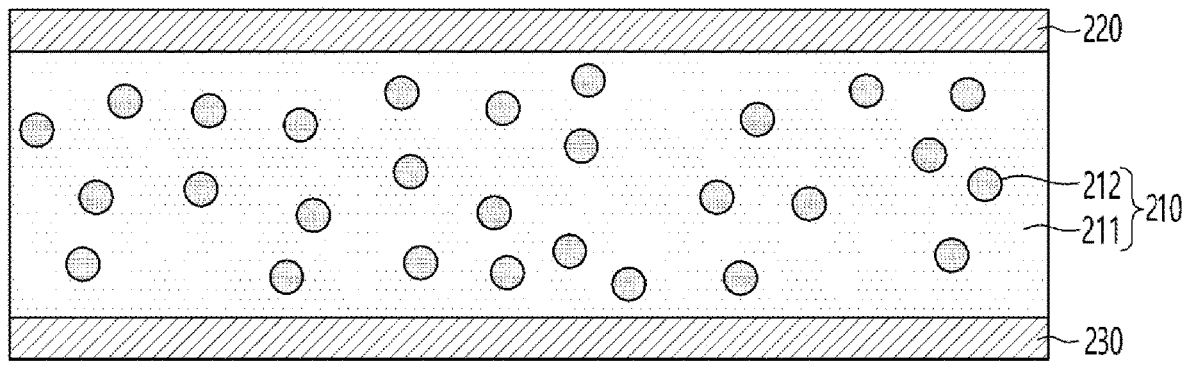
FIGS. 8 to 12 are views showing a method of manufacturing the circuit board according to the second embodiment in the order of the process.

Referring to FIG. 8, in the embodiment, a resin coated copper (RCC) as a basis for manufacturing a circuit board is prepared. The resin coated copper (RCC) includes an insulating layer 210 that is a composite of a resin 211 and a filler 212, and copper foil layers 220 and 230 disposed on both surfaces of the insulating layer 210.

Figure 9:
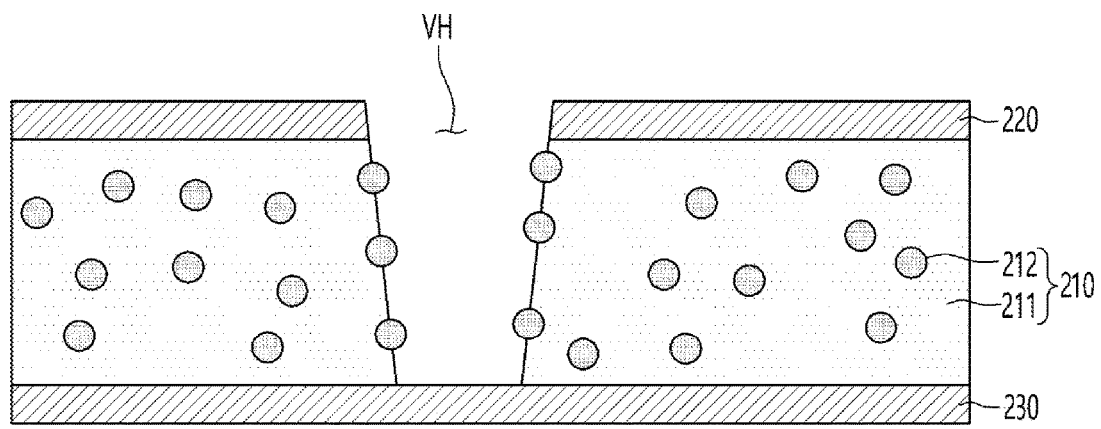

Next, referring to FIG. 9, in the embodiment, a via hole VH passing through the copper foil layer 220 and the insulating layer 210 is formed. The via hole VH may be formed by a laser process, but is not limited thereto. In this case, the filler 212 is a silica filler made of any one of $SiO_2$, $ZrO_3$, $HfO_2$, and $TiO_2$ ceramic materials. Accordingly, the filler 212 may be exposed through the via hole VH when the via hole VH is formed.

Next, referring to FIG. 10, in the embodiment, a process of removing the filler 212 exposed through the via hole VH may be performed. The process of removing the filler 212 may be performed using a glass etching solution. For example, in an embodiment, after the via hole VH is formed, the filler 212 exposed through the via hole VH may be removed using fluorine (HF), which is a glass etching solution. Accordingly, a recess R corresponding to a position where the filler 212 is removed may be formed in the inner wall of the via hole VH of the insulating layer 210.

In this case, the inner wall of the via hole VH of the insulating layer 210 may have a surface roughness Ra corresponding to the depth of the recess R. For example, the depth of the recess R of the inner wall of the via hole VH may range from 0.5 μm to 1.0 μm. Accordingly, the surface roughness Ra of the inner wall of the via hole VH may be in a range of 0.5 μm to 1.0 μm.

Meanwhile, the surface roughness Ra of the inner wall of the via hole VH may be determined by the ratio of the area occupied by the recess R to a total area of the inner wall of the via hole VH. And, in the embodiment, the recess R occupies 3% to 10% of the total area of the inner wall of the via hole VH. That is, when the area occupied by the recess R from the total area of the inner wall of the via hole VH is less than 3%, this indicates that the content of the filler included in the insulating layer 210 is lower than 20%. This means that the insulation layer 210 has a weak rigidity, so it may be difficult to manufacture a normal circuit board. In addition, when the area occupied by the recess R from the total area of the inner wall of the via hole VH is less than 3%, the surface roughness Ra of the inner wall of the via hole VH may be less than 0.5 μm. and thus, reliability problems may occur. In addition, when the area occupied by the recess R in the total area of the inner wall of the via hole VH is greater than 10%, the content of the filler 212 included in the insulating layer 210 may be greater than 80 vol %. Accordingly, the insulating layer 210 may not have a low dielectric constant of 2.5 Dk or less. In addition, when the area occupied by the recess R from the total area of the inner wall of the via hole VH is greater than 10%, the surface roughness Ra of the inner wall of the via hole VH may be greater than 1.0 μm, and thus, a skin effect may occur.

Meanwhile, a plurality of recesses R may be included in the inner wall of the via hole VH. In this case, each of the recesses R may correspond to the shape and diameter of the filler 212. For example, the recess R may have the depth corresponding to a diameter of the filler 212. The filler 212 may have a diameter in the range of 0.5 μm to 1.0 μm. In addition, the depth of the recess R formed in the inner wall of the via hole VH may correspond to the diameter of the filler 212. In addition, when the depth of the recess R is greater than 1.0 μm, the size of the via hole may be excessively expanded in the process of removing the filler exposed through the via hole VH. In addition, reliability problems may occur due to the expansion of the size of the via hole. Accordingly, the filler 212 in the embodiment may have a diameter in the range of 0.5 μm to 1.0 μm, and the recess R may have a depth corresponding to the diameter of the filler 212.

Figure 11:
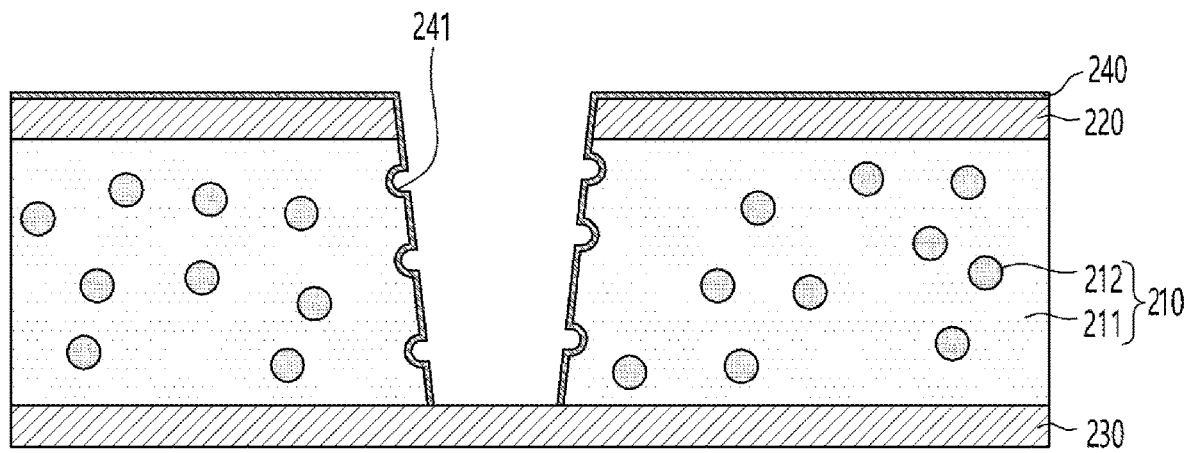

Next, referring to FIG. 11, in the embodiment, the first plating layer 240 is formed on an upper surface of the copper foil layer 220 and the inner wall of the via hole VH through a chemical copper plating method. In this case, a portion 241 of the first plating layer 240 disposed in the recess R may be convex.

Figure 12:
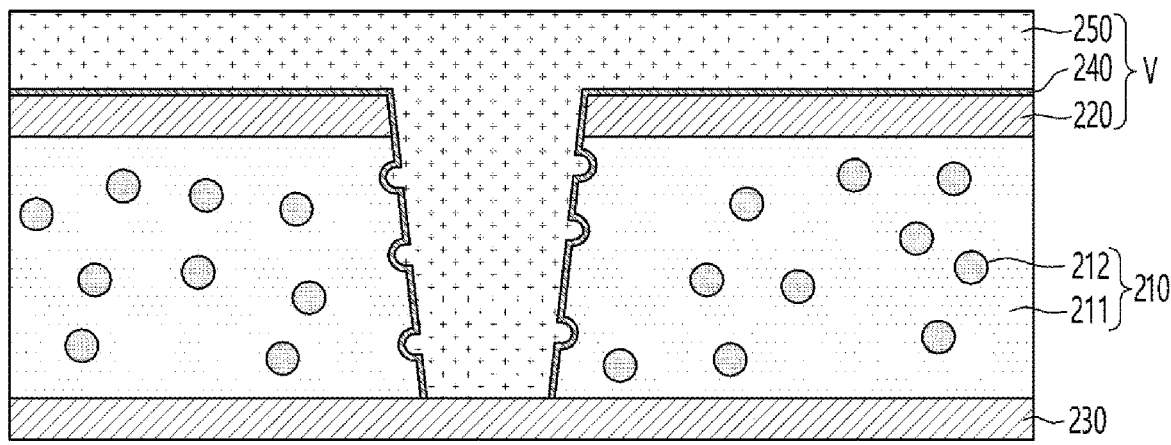

Next, referring to FIG. 12, in an embodiment, electrolytic plating is performed using the first plating layer 240 as a seed layer. Accordingly, in the embodiment, the second plating layer 250 filling the inside of the via hole VH may be formed.

Figure 13:
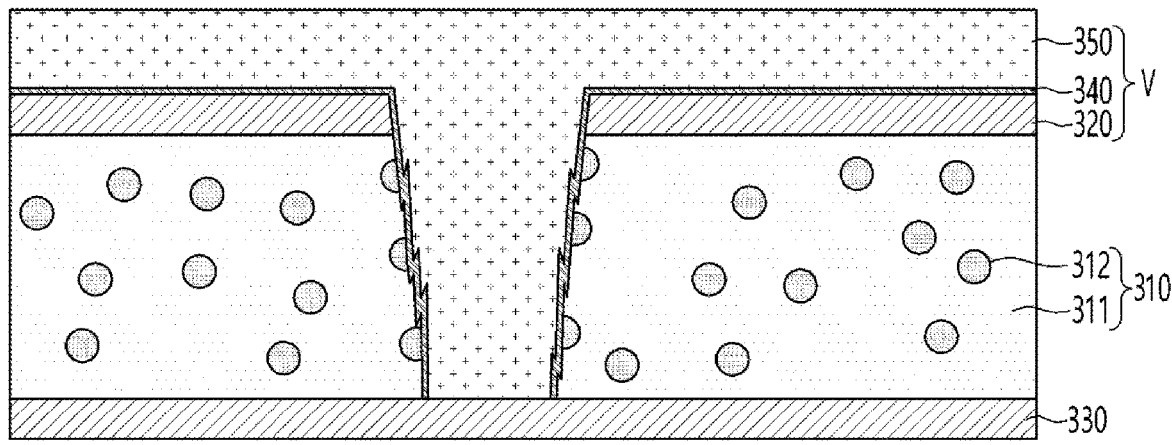
FIG. 13 is a view showing a circuit board according to a third embodiment.
Figure 14:
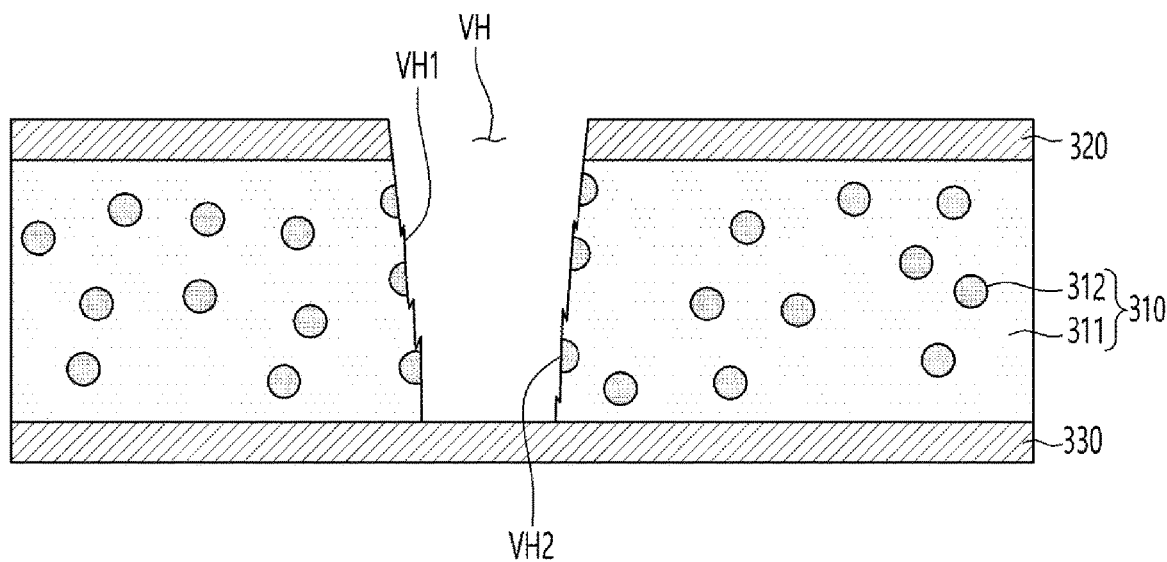
FIGS. 14 to 16 are views showing a method of manufacturing the circuit board of FIG. 13.
Figure 15:
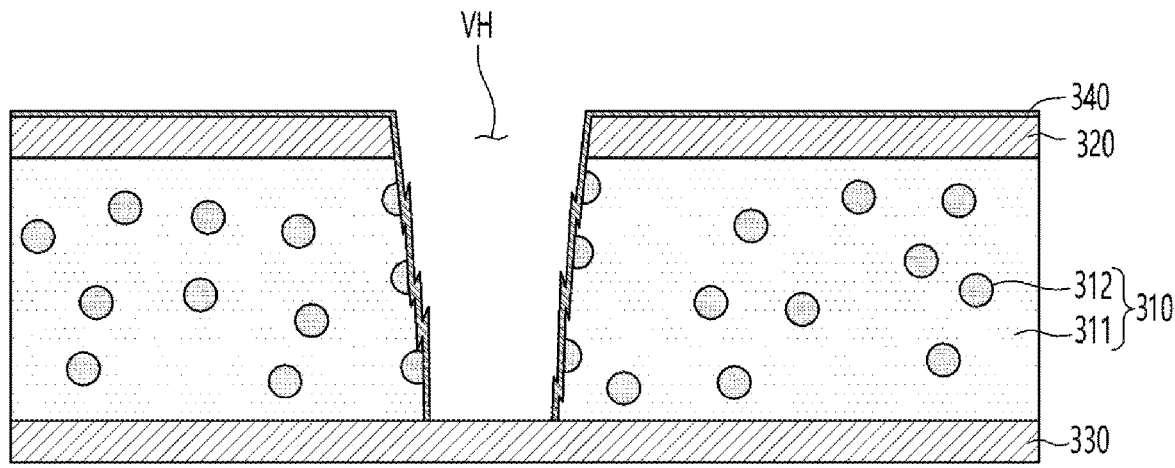
Figure 16:
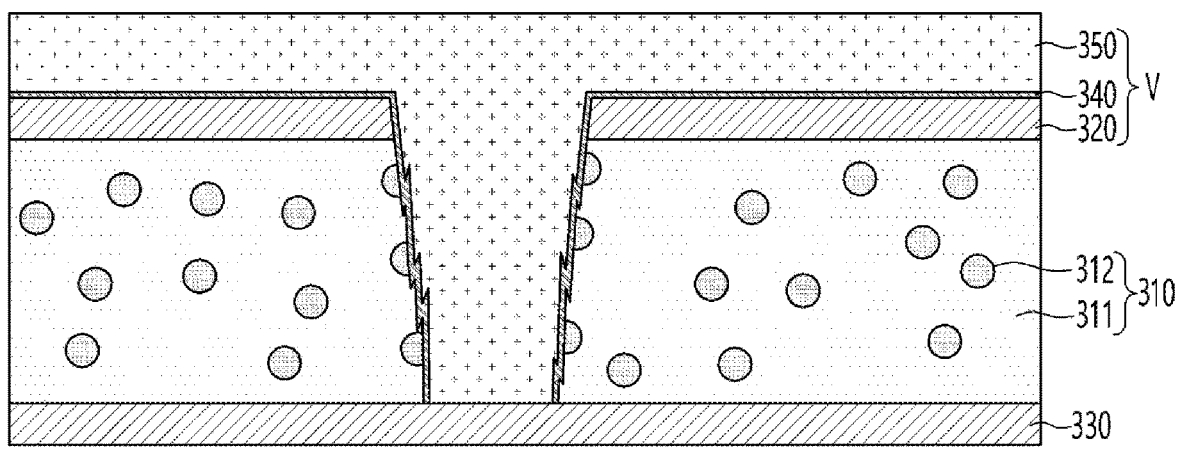

FIG. 13 is a view showing a circuit board according to a third embodiment, and FIGS. 14 to 16 are views showing a method of manufacturing the circuit board of FIG. 13.

Referring to FIG. 13, the circuit board may include an insulating layer 310, copper foil layers 320 and 330, a first plating layer 340, and a second plating layer 350. In this case, the insulating layer 310 includes a resin 311 and a filler 312.

In this case, in the second embodiment, a recess R corresponding to the filler 212 is formed by removing the filler 212 exposed through the via hole VH, and the via hole VH is formed. The inner wall of the to have a surface roughness (Ra) corresponding to the depth of the recess (R).

The structure of the circuit board according to the third embodiment will be described in conjunction with the description of the manufacturing method.

In the method of manufacturing a circuit board according to the third embodiment, since the via hole forming process shown in FIGS. 8 and 9 is the same as the manufacturing process of the second embodiment, a description thereof will be omitted.

Referring to FIG. 14, in the third embodiment, when the via hole VH is formed, the inner wall of the via hole VH and the filler 312 exposed through the via hole VH are surface-treated using plasma. In this case, in the second embodiment, the filler 212 exposed through the via hole VH is removed. Accordingly, in the second embodiment, the recess R corresponding to the removed filler is formed, and the surface roughness Ra corresponding to the depth of the recess R is implemented.

Unlike this, in the third embodiment, the surface roughness Ra is realized by scraping the inner wall of the via hole VH through plasma surface treatment. In this case, the inner wall of the via hole VH in the second embodiment is formed of only the resin 211 of the insulating layer 210. Meanwhile, the inner wall of the via hole VH in the third embodiment may have a first portion VH1 formed of the resin 311 of the insulating layer 310 and a second portion VH2 formed of the filler 312. In addition, the first portion VH1 and the second portion VH2 may have a surface roughness Ra in a range of 0.5 μm to 1.0 μm through the plasma surface treatment.

In other words, in the second embodiment, the recess R is formed by completely removing the filler exposed through the inner wall of the via hole VH of the insulating layer 110. Accordingly, the inner wall of the via hole VH is made of only resin. In other words, in the second embodiment, the filler is not exposed through the via hole VH.

Meanwhile, in the third embodiment, the resin 311 and the filler 312 exposed through the inner wall of the via hole VH of the insulating layer 310 are surface-treated with plasma. Accordingly, the inner wall of the via hole VH including the resin 311 and the filler 312 has a surface roughness Ra in the range of 0.5 μm to 1.0 μm.

Next, referring to FIG. 15, in the third embodiment, a first plating layer 340 is formed on the upper surface of the copper foil layer 320 and the inner wall of the via hole VH through a chemical copper plating method. In this case, the second plating layer 350 may be respectively disposed on the resin 311 and the filler 312 constituting the inner wall of the via hole VH.

Next, referring to FIG. 16, in the third embodiment, electrolytic plating may be performed on the first plating layer 340 as a seed layer to form a second plating layer 350 filling the inside of the via hole VH.

Features, structures, effects, and the like described in the embodiments above are included in at least one embodiment, and are not necessarily limited to only one embodiment. Furthermore, the features, structures, effects, and the like illustrated in each embodiment may be combined or modified for other embodiments by a person having ordinary knowledge in the field to which the embodiments belong. Therefore, the contents related to these combinations and modifications should be construed as being included in the scope of the embodiment.

Although the embodiments have been described above, these are only examples and are not intended to limit the embodiments, and those of ordinary skill in the field to which the embodiments belong to various types not exemplified above without departing from the essential characteristics of the present embodiment. It will be seen that branch transformation and application are possible. For example, each component specifically shown in the embodiment can be modified and implemented. And differences related to these modifications and applications should be construed as being included in the scope of the embodiments set in the appended claims.

What is claimed is:

1. A circuit board comprising:
   an insulating layer;
   a circuit pattern disposed on the insulating layer; and
   a via disposed in a via hole passing through the insulating layer,
   wherein the circuit pattern includes:
      a copper foil layer disposed on the insulating layer,
      a first plating layer disposed on the copper foil layer, and
      a second plating layer disposed on the first plating layer, and
   wherein the insulating layer includes a resin and a filler in the resin, and
   wherein a recess is provided at an inner wall of the via hole and has a shape corresponding to the filler.

2. The circuit board of claim 1, wherein the insulating layer and the copper foil layer are a resin coated copper (RCC).

3. The circuit board of claim 1, the copper foil layer has a 10-point average roughness (Rz) in a range of 1.5 μm to 3.0 μm.

4. The circuit board of claim 1, the first plating layer has a thickness in a range of 1 μm to 2.5 μm.

5. The circuit board of claim 1, wherein the second plating layer has a thickness in a range of 10 μm to 25 μm.

6. The circuit board of claim 1,
wherein the via contacts the resin and does not contact the filler.

7. The circuit board of claim 1, wherein a thickness of the copper foil layer is different from a thickness of the first plating layer.

8. The circuit board of claim 1, wherein the recess has a depth in a range of 0.5 μm to 1.0 μm.

9. The circuit board of claim 7,
wherein the recess has a width corresponding to a diameter of the filler.

10. The circuit board of claim 9, wherein the diameter of the filler has a range of 0.5 μm to 1.0 μm.

11. The circuit board of claim 9, wherein an area of the recess is 3% to 10% of a total area of inner wall of the via hole.

12. The circuit board of claim 11, wherein the inner wall of the via hole has a surface roughness (Ra) in a range of 0.5 μm to 1.0 μm,
wherein the via has a surface roughness corresponding to the inner wall of the via hole.

13. The circuit board of claim 1, wherein the via comprises:
a first via layer corresponding to the first plating layer; and
a second via layer corresponding to the second plating layer.

14. The circuit board of claim 7, wherein the thickness of the copper foil layer is greater than the thickness of the first plating layer.

15. The circuit board of claim 7, wherein the thickness of the copper foil layer has a range of 2 μm to 5 μm.

16. The circuit board of claim 1, wherein the via includes a convex portion disposed in the recess of the via hole.

* * * * *